(12) United States Patent
Hirano

(10) Patent No.: US 7,189,660 B2
(45) Date of Patent: Mar. 13, 2007

(54) METHOD OF PRODUCING INSULATOR THIN FILM, INSULATOR THIN FILM, METHOD OF MANUFACTURING SEMICONDUCTOR DEVICE, AND SEMICONDUCTOR DEVICE

(75) Inventor: Tomoyuki Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/957,948

(22) Filed: Oct. 4, 2004

(65) Prior Publication Data

US 2005/0116266 A1   Jun. 2, 2005

(30) Foreign Application Priority Data

Oct. 7, 2003   (JP)   ............................. 2003-347931

(51) Int. Cl.
   *H01L 21/31*   (2006.01)

(52) U.S. Cl. .......... 438/761; 257/E29.13; 257/E21.435

(58) Field of Classification Search ................ 438/785, 438/786, 682, 721, 761, 710, 711
See application file for complete search history.

(56) References Cited

U.S. PATENT DOCUMENTS

| 6,174,809 | B1 * | 1/2001 | Kang et al. ................. 438/682 |
| 2002/0146916 | A1 * | 10/2002 | Irino et al. .................. 438/785 |
| 2004/0266045 | A1 * | 12/2004 | Mears et al. .................. 438/47 |
| 2005/0184286 | A1 * | 8/2005 | Mears et al. .................. 257/28 |

FOREIGN PATENT DOCUMENTS

JP   2001 223215 A   *   8/2001

* cited by examiner

*Primary Examiner*—Asok Kumar Sarkar
*Assistant Examiner*—Victor V. Yevsikov
(74) *Attorney, Agent, or Firm*—Robert J. Depke; Rockey, Depke, Lyons Kitzinger LLC

(57) ABSTRACT

A method of producing an insulator thin film, for forming a thin film on a substrate by use of the atomic layer deposition process, includes a first step of forming a silicon atomic layer on the substrate and forming an oxygen atomic layer on the silicon atomic layer, and a second step of forming a metal atomic layer on the substrate and forming an oxygen atomic layer on the metal atomic layer, wherein the concentration of the metal atoms in the insulator thin film is controlled by controlling the number of times the first step and the second step are carried out.

11 Claims, 8 Drawing Sheets

METHOD OF PRODUCING INSULATOR THIN FILM, INSULATOR THIN FILM, METHOD OF MANUFACTURING SEMICONDUCTOR DEVICE, AND SEMICONDUCTOR DEVICE

BACKGROUND OF THE INVENTION

The present invention relates to a method of producing an insulator thin film, an insulator thin film formed by the producing method, a method of manufacturing a semiconductor device using the insulator thin film, and a semiconductor device, with which it is easy to freely control the concentration gradient of a metal in a film.

Miniaturization of MOS transistors have already been coming to a gate length of 0.1 µm. The miniaturization leads to a further enhancement of operating speed of devices, a further reduction in electric power consumption, and a further reduction in the area occupied by the device. Recently, in addition, it has become possible to mount a larger number of devices per a fixed chip area, and it has therefore been realized to increase the number of functions of LSIs themselves. However, the pursuit of miniaturization is expected to be encountered by large walls, with the 0.1 µm rule as a boundary. One of the walls is the limitation in thinning the gate oxide film of a transistor. For the gate insulation film in a related-art transistor, silicon oxide ($SiO_2$) has been used because silicon oxide can satisfy the two characteristics which are indispensable on a device operation basis, namely, the characteristic that few immobile electric charges are contained in the film and the characteristic that an interface level is little formed at the boundary between the film and silicon of the channel portion. Besides, silicon oxide has been effective also for miniaturization of devices, since a thin film of silicon oxide can be easily formed with good controllability.

However, the dielectric constant (relative permittivity) of $SiO_2$ is as low as 3.9, so that in the transistors belonging to the generation of a gate length of 0.1 µm and the latter generations, a film thickness of 3 nm or below is required for fulfilling the transistor performances. In the case of such a film thickness, there is probably generated the problem that direct tunneling of carriers through the film would occur, resulting in an increase of leak current between the gate and the substrate.

In view of the above, a technique of forming the gate insulation film in a large thickness by use of a material higher in dielectric constant than $SiO_2$, for preventing the tunneling phenomenon, has been studied. As the material having a higher dielectric constant, there have been investigated films of metallic oxides such as aluminum oxide ($Al_2O_3$), zirconium oxide ($ZrO_2$), and hafnium oxide ($HfO_2$) (see, for example, Japanese Patent Laid-open No. 2003-69011). Since these oxide films are high in dielectric constant, the film thickness of each of these oxides for obtaining a predetermined gate capacity can be several times greater than that of the film of silicon oxide, and, therefore, these oxide films are considered to be promising materials for restraining the tunneling phenomenon.

However, in the process of manufacturing a transistor using an electrode of polysilicon (poly-Si) which is currently used for silicon oxide, an activation annealing at a temperature of 1000° C. or above is required. However, the high dielectric constant films (also called high-k films) of $ZrO_2$, $HfO_2$ and the like are low in heat resistance, are liable to undergo crystallization, and are liable to undergo a siliciding reaction with the silicon (Si) substrate, with the result of an increase in the leak current. In an attempt to solve these problems, it has been known that the heat resistance can be enhanced and the leak current can be reduced by using Hf(Zr)SiO or Hf(Zr)SiON to which silicon (Si) and nitrogen (N) have been added (see, for example, Japanese Patent Laid-open No. 2000-58832).

A problem to be solved lies in that, in the case of forming a high-k film according to the related art, immobile electric charges are generated at the boundaries between the high-k film and the Si substrate and the poly-Si electrode, resulting in a shift of threshold voltage (Vth) and mobility degradation. Another problem to be solved lies in that, in PMOS transistors, boron with which the gate electrode is doped would, upon the subsequent heat treatment, punch through the high dielectric constant film so as to diffuse to the substrate side. It has been known that the punch-through of boron can be restrained by the addition of nitrogen. However, in the case where nitrogen is added according to the related art, nitrogen would enter into the substrate, thereby increasing the interface level.

SUMMARY OF THE INVENTION

It is an object of the present invention to provide an insulator thin film with which is it possible to reduce immobile electric charges at the interface of a substrate and an electrode, and to restrain punch-through of boron without an increase in interface level, thereby forming a MOSFET free of Vth shift and mobility degradation.

In order to attain the above object, according to a first aspect of the present invention, there is provided a method of producing an insulator thin film, for forming a thin film on a substrate by use of the atomic layer deposition process, the method being characterized most principally by including a first step of forming a silicon atomic layer on the substrate and forming an oxygen atomic layer on the silicon atomic layer, and a second step of forming a metal atomic layer on the substrate and forming an oxygen atomic layer on the metal atomic layer, and is characterized by controlling the concentration of the metal atoms in the insulator thin film through controlling the number of times the first step and the second step are carried out.

In accordance with a second aspect of the present invention, there is provided an insulator thin film formed on a substrate by use of the atomic layer deposition process, the insulator thin film being characterized most principally in that the insulator thin film is formed by controlling the concentration of metal atoms in the insulator thin film by controlling the number of times a first step and a second step are carried out, the first step including forming a silicon atomic layer on the substrate and forming an oxygen atomic layer on the silicon atomic layer, by use of the atomic layer deposition process, and the second step including forming a metal atomic layer on the substrate and forming an oxygen atomic layer on the metal atomic layer, by the atomic layer deposition process.

In accordance with a third aspect of the present invention, there is provided a method of manufacturing a semiconductor device, including the step of forming an insulator thin film, wherein the manufacturing method is characterized most principally in that the insulator thin film forming step includes: a first step of forming a silicon atomic layer on a substrate and forming an oxygen atomic layer on the silicon atomic layer, by use of the atomic layer deposition process; and a second step of forming a metal atomic layer on the substrate and forming an oxygen atomic layer on the metal atomic layer, by use of the atomic layer deposition process, and the manufacturing method is characterized in that the concentration of the metal atoms in the insulator thin film is controlled by controlling the number of times the first step and the second step are carried out.

In accordance with a fourth aspect of the present invention, there is provided a semiconductor device including an insulator thin film, wherein the semiconductor device is characterized most principally in that the insulator thin film is formed by carrying out: a first step of forming a silicon atomic layer on a substrate and forming an oxygen atomic layer on the silicon atomic layer, by use of the atomic layer deposition process; and a second step of forming a metal atomic layer on the substrate and forming an oxygen atomic layer on the metal atomic layer, by use of the atomic layer deposition process, and the semiconductor device is characterized in that the concentration of the metal atoms in the insulator thin film is controlled by controlling the number of times the first step and the second step are carried out.

The method of producing an insulator thin film and the insulator thin film according the present invention includes, and is formed by, a first step of forming a silicon atomic layer on a substrate and forming an oxygen atomic layer on the silicon atomic layer, by the atomic layer deposition process, and a second step of forming a metal atomic layer on the substrate and forming an oxygen atomic layer on the metal atomic layer, by the atomic layer deposition process. Therefore, a silicon oxide film and a metal oxide film can be formed in a thickness of one atomic layer. In addition, by controlling the number of times the first step and the second step are carried out, the insulator thin film can be formed in the condition where the concentration of metal atoms has a gradient. Therefore, it is possible to ensure that no metal atom is contained at the interface of the insulator thin film, or to extremely reduce the concentration of the metal atoms. Accordingly, a high dielectric constant film can be formed to be thick, so that, in the insulator thin film formed by the method of producing an insulator thin film according to the present invention, punch-through of boron would not occur, and, in the case where the method is applied to a gate insulation film of a MOSFET, a favorable high dielectric constant film free of Vth shift and mobility degradation can be obtained advantageously.

The method of manufacturing a semiconductor device an the semiconductor device according to the present invention includes, and is manufactured by, a first step of forming a silicon atomic layer on a substrate and forming an oxygen atomic layer on the silicon atomic layer, by use of the atomic layer deposition process, and a second step of forming a metal atomic layer on the substrate and forming an oxygen atomic layer on the metal atomic layer, by use of the atomic layer deposition process. Therefore, an insulator thin film composed of a silicon oxide film and a metal oxide film laminated on each other can be formed in a thickness of one atomic layer. Besides, by controlling the number of times the first step and the second step are carried out, the insulator thin film can be formed in the condition where the concentration of metal atoms has a gradient. Therefore, it is possible to ensure that no metal atom is contained at the interface of the insulator thin film, or to extremely reduce the concentration of the metal atoms. Accordingly, a high dielectric constant film can be formed to be thick, so that, in the insulator thin film produced by the method of producing an insulator thin film according to the present invention, punch-through of boron would not occur, and, in the case where the method is applied to a gate insulation film of a MOSFET, a favorable transistor free of Vth shift and mobility deterioration can be formed advantageously.

BRIEF DESCRIPTION OF THE DRAWINGS

The above and other objects, features and advantages of the present invention will become apparent from the following description and appended claims, taken in conjunction with the accompanying drawings, in which:

DETAILED DESCRIPTION OF THE PREFERRED EMBODIMENTS

In the present invention, the object consisting in providing an insulator thin film with which it is possible to reduce immobile electric charges at the interface between a substrate and an electrode, to restrain the punch-through of boron without an increase in interface level, and thereby to form a favorable MOSFET free of Vth shift and mobility degradation, is realized by causing the concentration of the metal atoms contained in the insulator thin film to have a gradient through controlling the concentration of the metal atoms in the insulator thin film by controlling the number of times a first step and a second step are carried out, the first step including forming a silicon atomic layer on a substrate and forming an oxygen atomic layer on the silicon atomic layer, by the atomic layer deposition process, and a second step including forming a metal atomic layer on the substrate and forming an oxygen atomic layer on the metal atomic layer, by the atomic layer deposition process.

Embodiment 1

Figure 2:
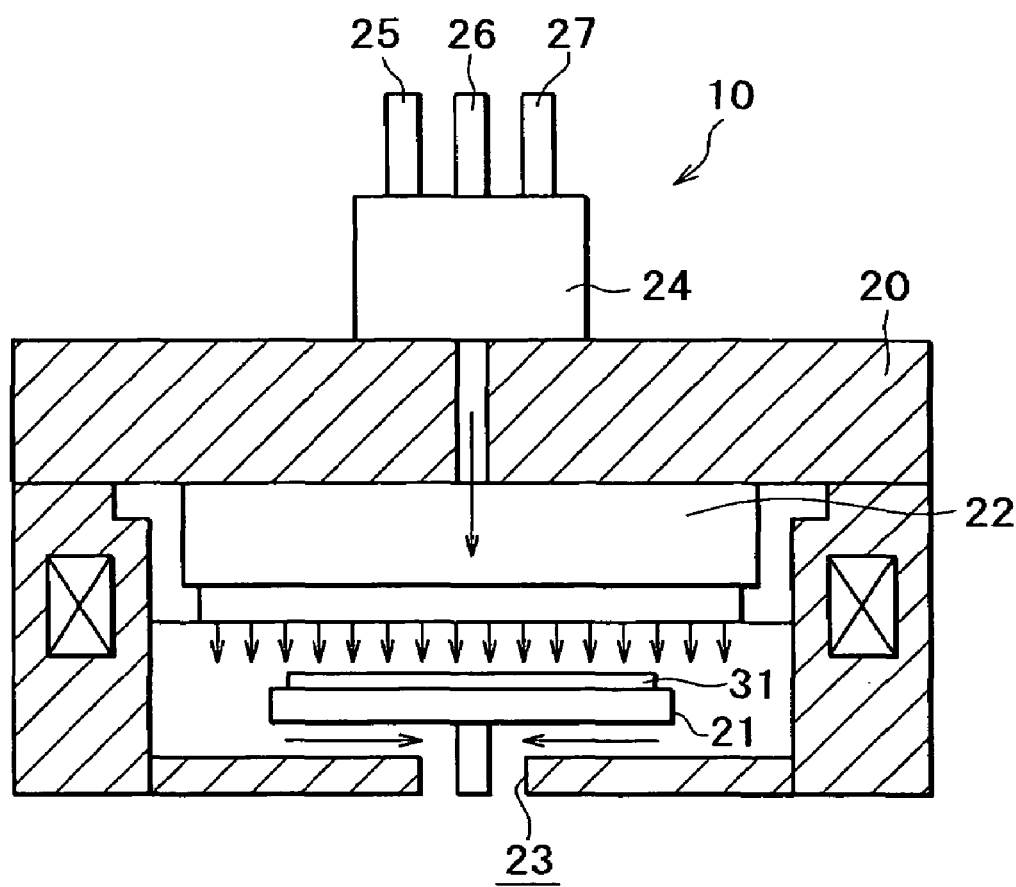
FIG. 2 is a general configuration diagram of a thin film production system.

As shown in FIG. 2, a thin film forming system 10 includes a chamber 20. The chamber 20 is equipped with an external heater (not shown), and the chamber 20 is heated by the heater. A stage (susceptor) 21 for mounting thereon a substrate 3 on which to form an insulator thin film is provided in the inside of the chamber 20. A shower head 22 for supplying raw material gases is provided at a position opposite to the substrate mount surface of the stage 21. An exhaust port 23 for discharging the raw material gases in the chamber 20 is provided at a bottom portion of the chamber 20, and the exhaust port 23 is connected to an evacuation system (not shown). The shower head 22 is provided with a gas inlet port 23 and a gas selector valve 24, in this order from the interior side of the chamber 20. Supply pipes 25, 26, 27 for supplying, for example, a first raw material gas, a second raw material gas and a purging inert gas are connected to the gas selector valve 24. While the number of the supply pipes in this figure is three, the number may be appropriately increased or decreased according to kinds of the raw material gases used. Incidentally, the arrows in the drawing indicates schematically the directions in which the gases flow.

In the thin film forming system 10, the substrate 31 on which to form the insulator thin film is mounted inside the chamber 20, then the inside of the chamber 20 is once evacuated by the evacuation system (not shown), thereafter raw material gases are introduced from the supply pipes 25, 26 into the chamber 20 through the gas selector valve 24, and part of the gases in the chamber 20 is exhausted by the evacuation system, whereby the inside of the chamber 20 is maintained at a predetermined pressure. Under this condition, a film is formed on the surface of the substrate 31. The film formation process will be detailed later. In this case, the chamber 20 can be heated to a desired temperature by the heater (not shown). After completion of the film formation, the inside of the chamber 20 is purged, to set the inside of the chamber 20 to the atmospheric pressure, and the substrate 31 is taken out.

Figure 1A:
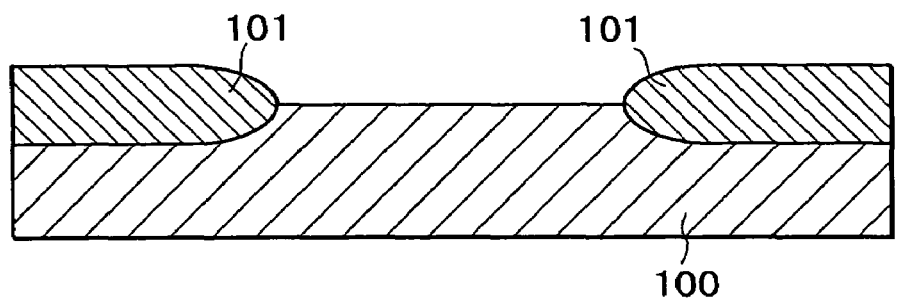
FIGS. 1A to 1C show production process diagrams showing one embodiment according to the method of producing an insulator thin film and the insulator thin film according to the present invention.
Figure 1B:
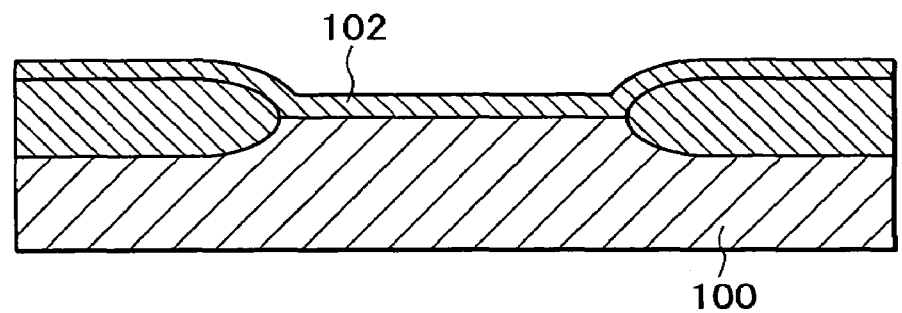
Figure 1C:
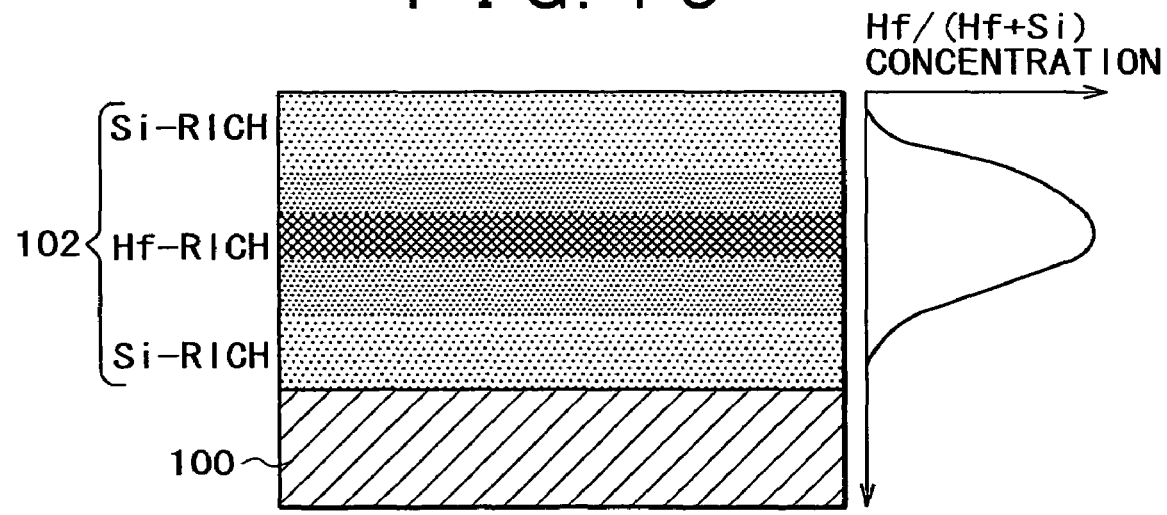

Next, the method of producing the insulator thin film will be described referring to the production process diagrams shown in FIGS. 1A to 1C. Referring to FIGS. 1A to 1C, as one example, a process of manufacturing an insulated gate type field effect transistor (for example, MOSFET) in which the insulator thin film formed by the method of producing an insulator thin film according to the present invention is applied to a gate insulation film will be described.

As shown in FIG. 1A, for example, a silicon substrate as a semiconductor substrate is used as the substrate 100. By a known manufacturing process, the substrate 100 is provided with insulation regions 101 to be device separators. While the insulation regions 101 formed by local oxidation process (LOCOS process) are shown in the drawing, insulation regions formed by the trench isolation technology may be adopted.

The surface of the substrate 100 is cleaned. The cleaning is conducted by using, for example, a solution prepared by mixing ammonia, hydrogen peroxide solution and pure water so as to decontaminate the surface of the substrate 100. Subsequently, a spontaneous oxide film on the surface of the substrate 100 is removed, for example, by immersing the substrate 100 in an aqueous hydrofluoric acid solution having an $HF/H_2O$ ratio of 1/100.

Next, as shown in FIG. 1B, an insulator thin film 102 composed of a silicon oxide ($SiO_2$) layer and a hafnium oxide ($HfO_2$) film is formed on the substrate 100 by the atomic layer deposition (ALD) process. The insulator thin film 102 is formed while controlling, on an atomic layer level, the formation of films of silicon oxide ($SiO_2$) and hafnium oxide ($HfO_2$) so that the vicinity of the interface and surface of the substrate 100 are put into a silicon oxide ($SiO_2$)-rich state and that the hafnium (Hf) concentration is increased in the central region of the film as shown in FIG. 1C.

One example of the film formation conditions resides in a film formation temperature of 200 to 500° C., a pressure of the film formation atmosphere of 13.3 to 133 Pa, an ozone ($O_3$) flow rate of 10 to 500 s/cm$^3$ (in normal condition), and flow rates of a silicon (Si) raw material gas and a hafnium (Hf) raw material gas of 10 to 500 s/cm$^3$ (in normal condition), under which the amount of hafnium oxide in silicon oxide is controlled, whereby the concentration of hafnium in the insulator thin film is determined.

Figure 3:
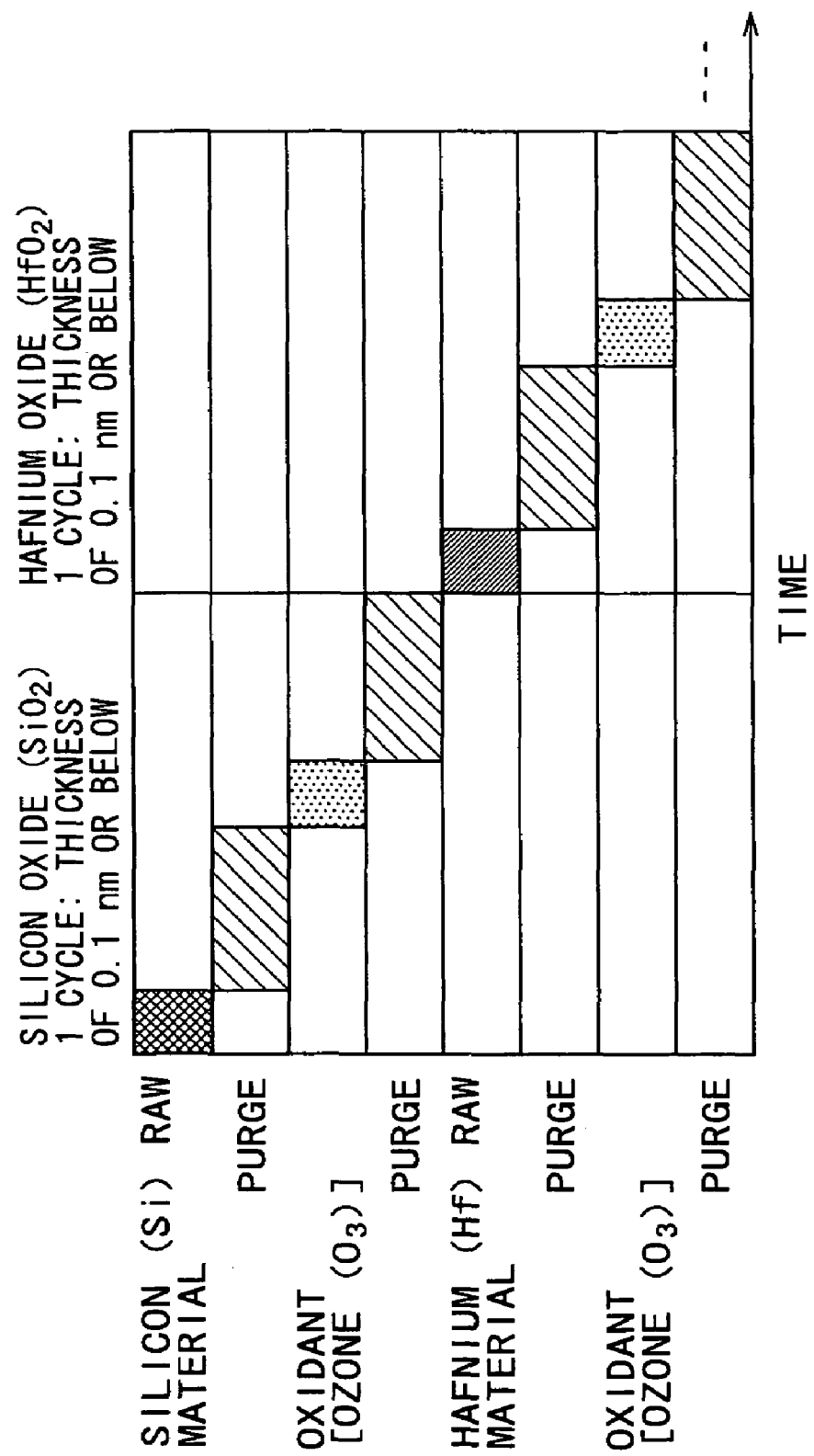
FIG. 3 is an illustration of the method of forming a film by the atomic layer deposition process.

One specific example of film formation method based on the ALD (Atomic Layer Deposition) process will be described referring to FIG. 3.

After forming a chemical oxide film on the surface of the substrate (silicon substrate) 100 from hydrogen fluoride (HF) or hydrogen fluoride ions (HF$^+$), a hafnium oxide ($HfO_2$) film and a silicon oxide ($SiO_2$) film are formed in the following manner.

The first step is conducted. Silicon tetrachloride ($SiCl_4$), for example is supplied as an Si raw material gas, to thereby cause chemical adsorption of the Si raw material onto the substrate 100. Thereafter, purging with an inert gas ($N_2$ or rare gas) is conducted, with the result that only silicon chloride ($SiCl_x$) adsorbed on the substrate 100 is left. Next, an oxidant (for example, $H_2O$ or $O_3$) is supplied to the substrate 100 on which silicon chloride ($SiCl_x$) has been adsorbed, to thereby form silicon oxide ($SiO_2$). Thereafter, purging with an inert gas ($N_2$ or rare gas) is conducted, whereby only silicon oxide ($SiO_2$) is left on the substrate 100 upon exhaust of the oxidant. As a result, an extremely thin film of silicon oxide having a thickness of about 0.1 nm (about one atomic layer) is formed.

The second step is conducted. Hafnium tetrachloride ($HfCl_4$), for example, is supplied as an Hf raw material gas, whereby the Hf raw material is chemically adsorbed on the substrate 100. Thereafter, purging with an inert gas ($N_2$ or rare gas) is conducted, whereby only hafnium chloride ($HfCl_x$) adsorbed on the substrate 31 is left. Next, an oxidant (for example, $H_2O$ or $O_3$) is supplied onto the substrate 100 on which hafnium chloride ($HfCl_x$) has been chemically adsorbed, whereby hafnium oxide ($HfO_2$) is formed. Thereafter, purging with an inert gas ($N_2$ or rare gas) is conducted, whereby only hafnium oxide ($HfO_2$) is left on the substrate 100 upon exhaust of the oxidant. As a result, an extremely thin film of hafnium oxide having a thickness of about 0.1 nm (about one atomic layer) is formed.

By controlling the cycle of the first step of forming silicon oxide ($SiO_2$) and the second step of forming hafnium oxide ($HfO_2$), the hafnium (Hf) concentration and concentration profile can be freely controlled. By adopting the film forming method as above, it was possible to form an insulator thin film (HfSiO film) 102 in which a silicon-rich film with a very low hafnium concentration is formed in the vicinity of the interface and surface of the insulator thin film 102 and in which a hafnium-rich film with a high hafnium concentration is formed in the vicinity of the center of the insulator thin film 102.

Examples of the material usable as the hafnium raw material include $HfCl_4$ (hafnium chloride), TDMAHf (tetradimethylaminohafnium), TDEAHf (tetradiethylaminohafnium), TEMAHf (tetramethylethylaminohafnium), and HTTB (tetra-tertiary-butoxyhafnium). Examples of the material usable as the silicon raw material include $SiCl_4$ (silicon chloride), TMDSO (tetramethyldisiloxane), TDMAS (tris(dimethylamino)silane), TDMASi (tetradimethylaminosilane), TDEASi (tetradiethylaminosilane), and TDMAHf (tetramethylethylsilane).

Figure 4:
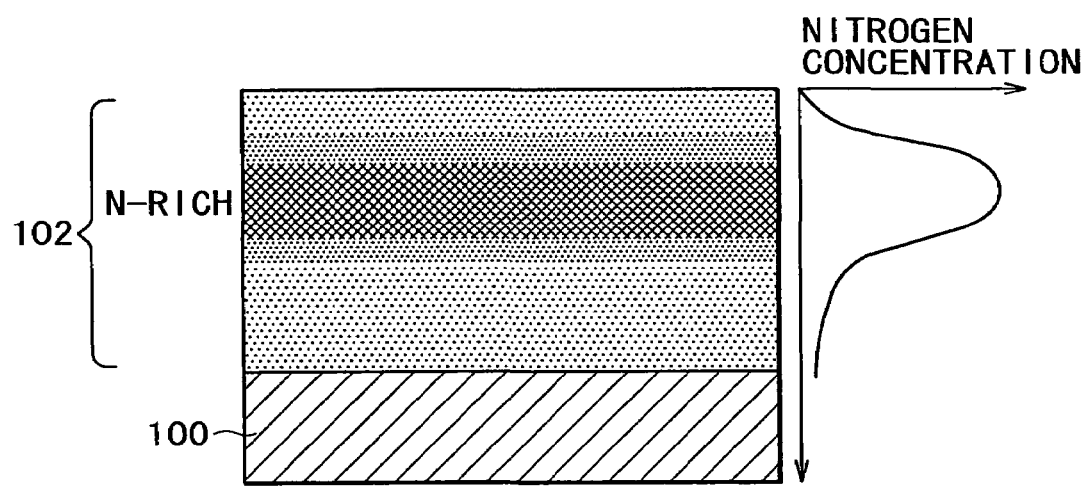
FIG. 4 is an illustration of nitrogen doping.

Next, the insulator thin film 102 formed in the above-mentioned manner is subjected to a nitriding treatment. The nitriding treatment is conducted, for example, by exposing the insulator thin film 102 to a plasma nitrogen atmosphere. The plasma is preferably generated by electric discharge using a pulse power source. One example of the conditions in this treatment will given below. The nitriding treatment was conducted under the conditions of a pressure of the nitriding treatment atmosphere of 0.133 to 13.3 Pa, a nitrogen ($N_2$) flow rate of 50 to 500 s/cm$^3$ (in normal condition), an RF power of 0.1 to 1.5 kW, a pulse period of 50 to 200 μs, a pulse duty of 10 to 80% (for example, 20%), a nitriding treatment temperature of from room temperature (for example, 23° C.) to 400° C., and a nitriding treatment time of 5 to 120 sec. By such a pulse discharge, the number of high-energy nitrogen ions is reduced, and, as shown in FIG. 4, the nitrogen profile in the insulator thin film 102 is sharper, as compared with the case of nitriding by continuous discharge, and the nitrogen concentration at the substrate interface is reduced. As a result, the interface level at the substrate interface is reduced, and the transistor characteristics are enhanced.

After the above-mentioned treatment is over, annealing in a nitrogen atmosphere is conducted, for enhancing the film quality of the insulator thin film 102. The annealing is carried out by adopting RTA (Rapid Thermal Annealing). As one example of the RTA conditions, the annealing was conducted in a nitrogen atmosphere at 1000° C. for 30 sec. While the annealing is conducted in the nitrogen atmosphere in this example, annealing in an atmosphere containing a tiny amount of oxygen can also produce the same effect as above. In that case, the amount of oxygen is such an amount as not to oxidize silicon, for example, an amount corresponding to an oxygen partial pressure of 6.6 Pa or below. As a result, the insulator thin film 102 became an HfSiON film.

The method of producing an insulator thin film and the insulator thin film as above-described includes, and is formed by, the first step of forming the silicon atomic layer on the substrate 100 and forming oxygen atomic layer on the silicon oxide layer, by use of the atomic layer deposition process, and the second step of forming the metal atomic layer on the substrate 100 and forming the oxygen atomic layer on the metal atomic layer, by the atomic layer deposition process. Therefore, a silicon oxide film and a metal oxide film can be formed in a thickness of one atomic layer. Besides, by controlling the number of times the first step and the second step are carried out, the insulator thin film 102 can be formed in the state where the concentration of the metal atoms has a gradient (the state in which the concentration varies continuously). Therefore, it is possible to ensure that no metal atom is contained at the interface of the insulator thin film 102, or to render the metal atom concentration very low. Accordingly, a high dielectric constant film can be formed to be thick, so that, in the insulator thin film 102 formed by the method of producing an insulator thin film according to the present invention, the punch-through of boron would not occur, and, in the case of using the insulator thin film 102 as a gate insulation film of a MOSFET, a favorable high dielectric constant film free of Vth shift and mobility degradation can be obtained advantageously.

Embodiment 2

Figure 5A:
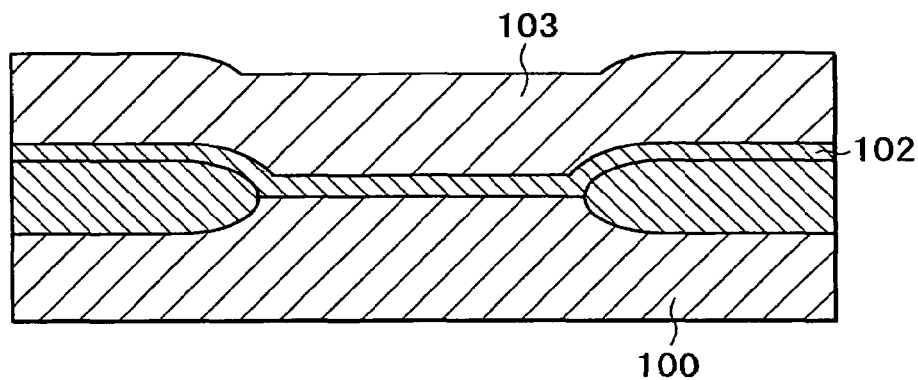
FIGS. 5A to 5C show manufacturing process diagrams showing one embodiment of the method of manufacturing a semiconductor device and the semiconductor device according to the present invention.
Figure 5B:
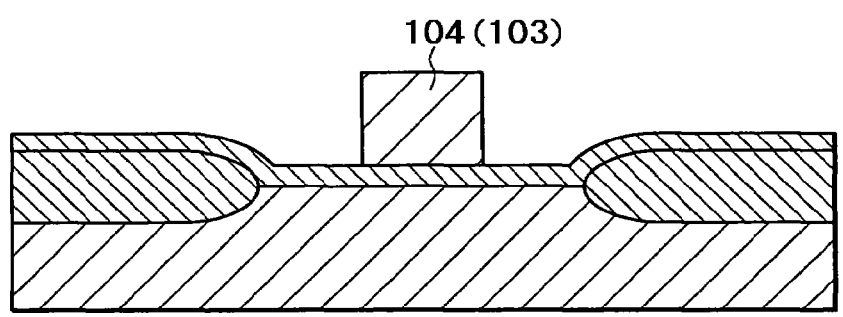
Figure 5C:
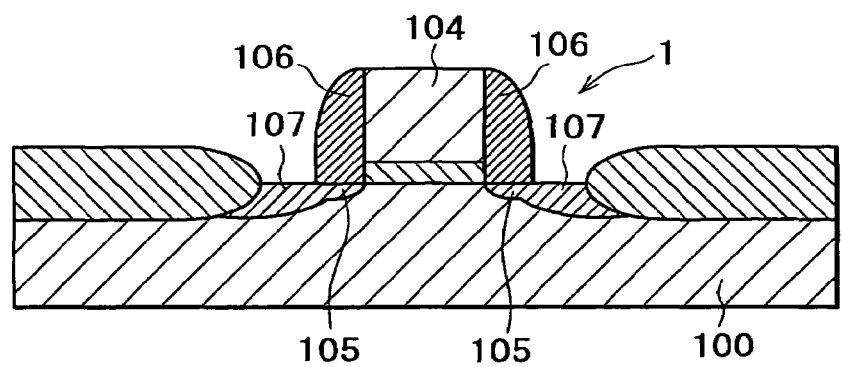

Next, one embodiment of the method of manufacturing a semiconductor device and the semiconductor device according to the present invention will be described referring to the manufacturing process diagrams in FIGS. 5A to 5C. FIGS. 5A to 5C illustrate one example of a semiconductor device in which the insulator thin film formed by the method of producing an insulator thin film in Embodiment 1 described above referring to FIGS. 1A to 1C is used as a gate insulation film, i.e., an insulated gate type field effect transistor.

As shown in FIG. 5A, an insulator thin film 102 is formed on a substrate (silicon substrate) 100 according to Embodiment 1 above. Next, a gate electrode material film 103 is formed on the insulator thin film 102. Polycrystalline silicon (polysilicon), for example, can be used for the gate electrode material film, and the chemical vapor deposition process can be used as one example of the film forming method. The film thickness was, for example, 180 nm. Thereafter, the gate electrode material film 103 is doped with a conductive substance (for example, phosphorus (P), boron (B), arsenic (As) or the like) by ion injection.

Next, as shown in FIG. 5B, the gate electrode material film 103 is processed by use of the usual lithography technique, etching technique and the like, to form a gate electrode 104. Dry etching is preferably used as the etching. In this manner, it was possible to constitute a gate structure in which the gate electrode 104 is formed on the substrate (silicon substrate) 100, with the insulator thin film 102 of HfSiON film therebetween.

Thereafter, as shown in FIG. 5C, the substrate 100 is provided with LDD (Lightly Doped Drain) regions 105 on both sides of the gate electrode 104 by the usual process for forming a diffusion layer of transistor. Next, side wall spacers 106 are formed on side walls of the gate electrode 104. Next, the substrate 100 is provided, on both sides of the gate electrode 104, with source/drain regions 107, with the LDD regions 105 therebetween. Thereafter, the LDD regions 105 and the source/drain regions 107 are subjected to activation annealing. As a result, an insulated gate type field effect transistor (for example, MOSFET) 1 could be formed as a semiconductor device.

In the method of manufacturing a semiconductor device and the semiconductor device, the insulator thin film 102 is formed by the method of producing an insulator thin film according to the present invention, so that the insulator thin film 102 composed of the silicon oxide film and the metal oxide film laminated on each other can be formed in a thickness of one atomic layer. Besides, by controlling the number of times the first step and the second step are carried out, the insulator thin film 102 can be formed in the state where the concentration of metal atoms has a gradient. Therefore, it is possible to ensure that no metal atom is contained at the interface of the insulator thin film 102, or to render the metal atom concentration very low. Accordingly, a high dielectric constant film can be formed to be thick, so that, in the insulated gate type field effect transistor (for example, MOSFET) using such an insulator thin film 102 as the gate insulation film, the punch-through of boron would not occur, and a favorable transistor free of Vth shift and mobility degradation can be obtained advantageously.

Figure 6:
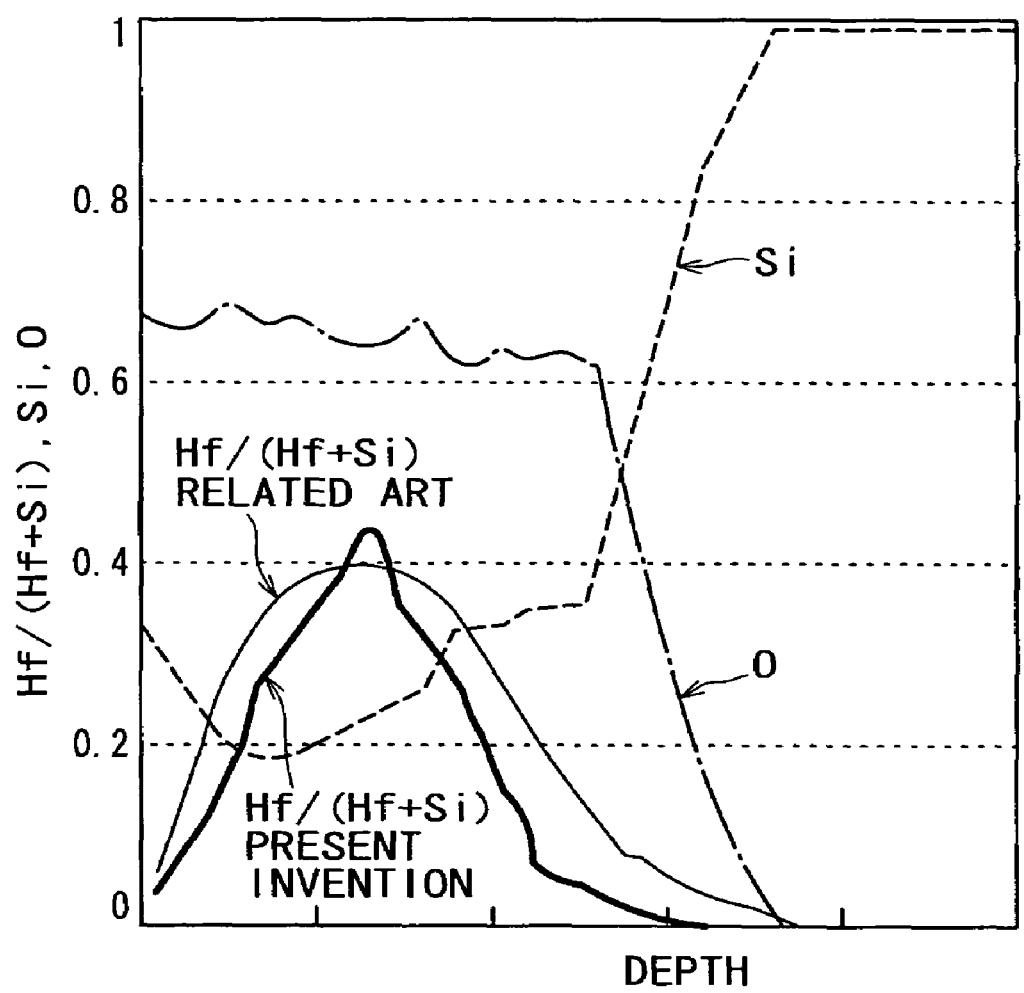
FIG. 6 is a relational diagram showing the relationships between Hf concentration based on Hf+Si, silicon concentration and oxygen concentration, and the depth in the film thickness direction of the insulator thin film.

Next, the Hf concentration profile in the HfSiO film produced by the method of producing an insulator thin film according to the present invention was measured by the high resolution Rutherford backscattering spectrometry (HR-RBS). The results of the measurement will be described referring to FIG. 6. In FIG. 6, Hf concentration based on Hf+Si, silicon concentration, and oxygen concentration are taken on the axis of ordinates, and the depth in the film thickness direction of the insulator thin film is taken on the axis of abscissas.

As shown in FIG. 6, it is seen that the HfSiO film formed by the method of producing an insulator thin film according to the present invention is lower in hafnium concentration at the substrate (silicon substrate) interface and the gate electrode interface, as compared with the HfSiO film formed according to the related art. Therefore, in the insulated gate type field effect transistor manufactured by producing the gate insulation film by use of the insulator thin film 102 composed of the HfSiO film obtained by the method of producing an insulator thin film according to the present invention, the numbers of immobile electric charges at the interface between the gate insulation film and the substrate and at the interface between the gate insulation film and the gate electrode can be reduced, as compared with those in the case where an HfSiO film produced by the related art is used as the gate insulation film.

Figure 7:
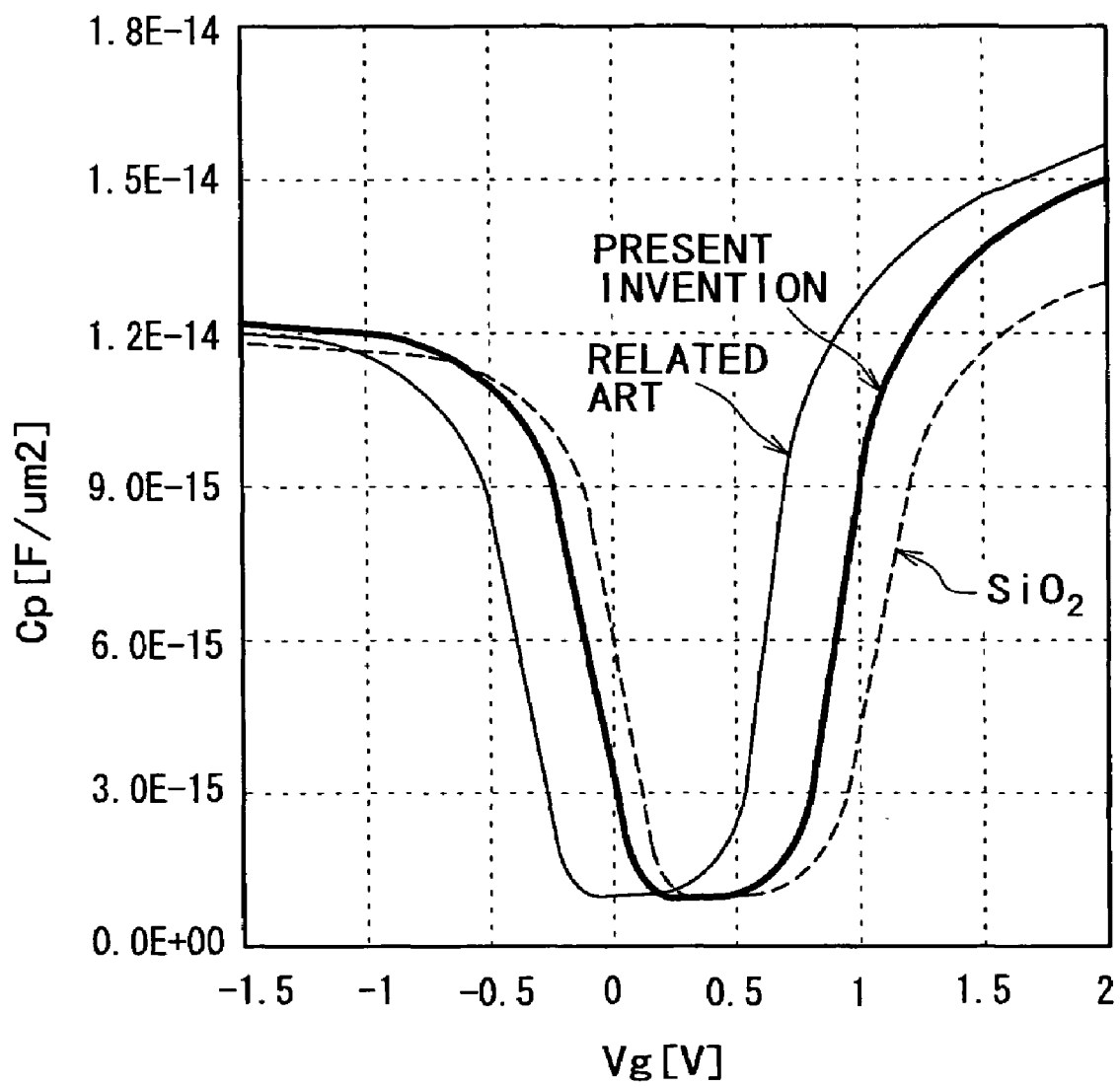
FIG. 7 is a C-V characteristic diagram in the case where an HfSiON film is applied to a gate insulation film of a PMOS transistor.

Next, capacity-voltage (CV) characteristic in the case where the HfSiON film formed by the method of producing an insulator thin film according to the present invention was applied to a gate insulation film in a PMOS transistor will be described referring to FIG. 7. In FIG. 7, capacity is taken on the axis of ordinates, gate voltage is taken on the axis of abscissas. As comparative examples, there are also shown the capacity (Cp)-voltage (Vg) characteristic (C-V characteristic) obtained in the case where an HfSiON film formed by the related art was applied to a gate insulation film of a PMOS transistor, and the capacity-voltage (CV) characteristic obtained in the case where a silicon oxide film was applied to a gate insulation film of a PMOS transistor.

As shown in FIG. 7, as compared with a PMOS transistor using silicon oxide ($SiO_2$) for the gate insulation film, the PMOS transistor in which the HfSiON film according to the related art was used as the gate insulation film showed an increased Vth shift in the negative direction of about 0.4 V, whereas the PMOS transistor in which the HfSiON film formed by the method of producing an insulator thin film according to the present invention showed a Vth shift in the negative direction of about 0.1 V, indicating a large reduction in Vth shift. Besides, it has also been confirmed that punch-through of boron (B) in the direction of the substrate is not occurring in the case where the gate electrode is formed of polysilicon and the gate electrode is doped with boron (B). This is considered to be due to the reduction of the numbers of immobile electric charges at the substrate interface and at the gate electrode interface formed of polysilicon.

Figure 8:
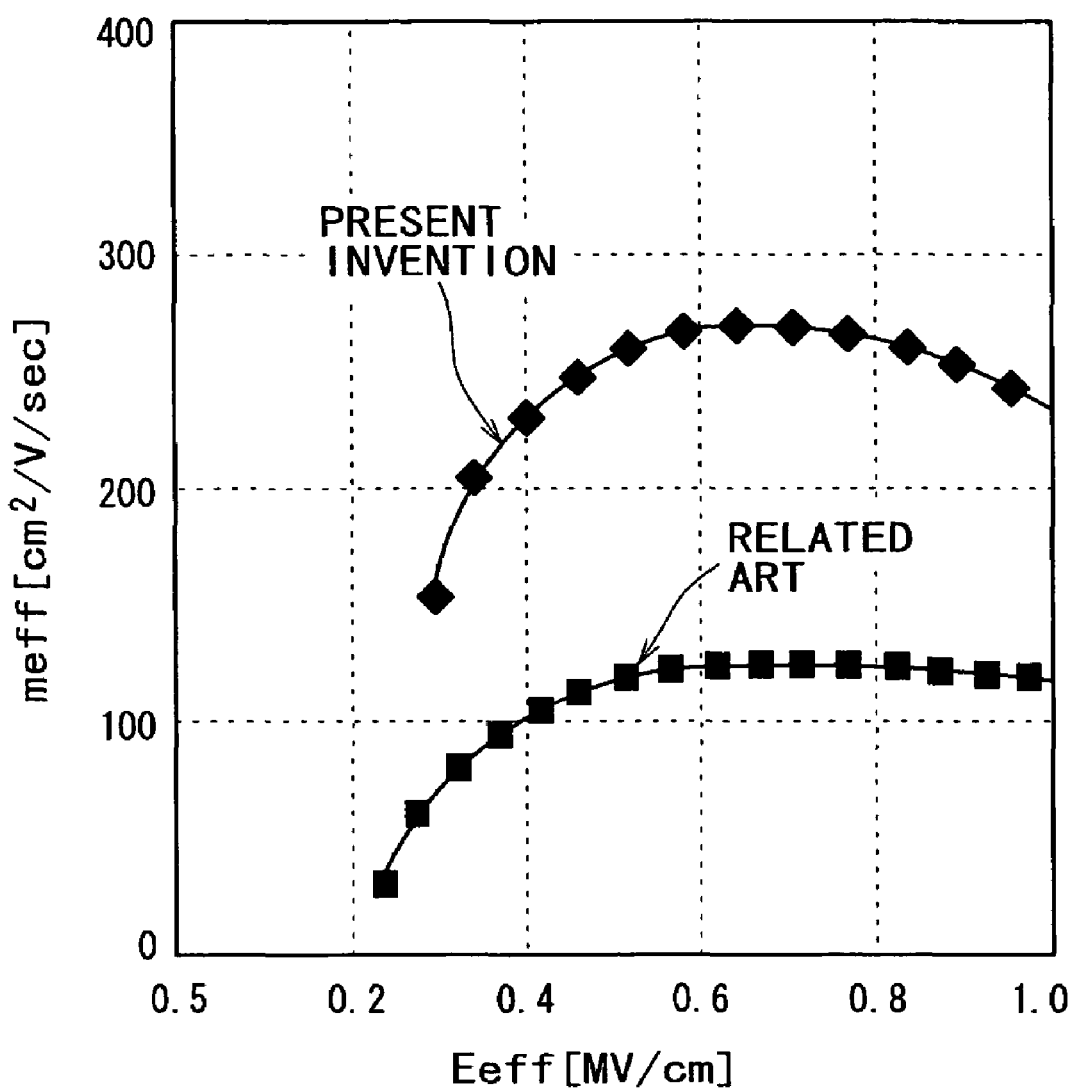
FIG. 8 is a relational diagram showing the relationship between transistor electric field and mobility, in the case where an HfSiON film is applied to a gate insulation film of an NMOS transistor.

Next, mobility in the case where the HfSiON film formed by the method of producing an insulator thin film according to the present invention was applied to a gate insulation film of an NMOS transistor will be described, referring to FIG. 8. In FIG. 8, mobility (meff) is taken on the axis of ordinates, and electric field (Eeff) is taken on the axis of abscissas. As a comparative example, the case where an HfSiON film formed by the related art was applied to a gate insulation film of an NMOS transistor is also shown in the figure.

As shown in FIG. 8, the NMOS transistor in which the HfSiON film according to the related art was used as the gate insulation film showed a mobility of about 120 $cm^2/V/s$, whereas the PMOS transistor in which the HfSiON film formed by the method of producing an insulator thin film according to the present invention showed a mobility of about 270 $cm^2/V/s$, indicating a large enhancement of mobility. This is considered to be due to a reduction in the number of immobile electric charge at the substrate interface.

While the silicon oxide layer is formed at the interface between the substrate and the insulator thin film in the atomic layer deposition process in the above-described embodiments, the same effects as above can be obtained also when a chemical oxide film formed by oxidation using, for example, sulfuric-hydrogen peroxide mixture (e.g., SA1), hydrochloric acid-hydrogen peroxide mixture (e.g., SC2), ammonia-hydrogen peroxide mixture (e.g., SC1), ozone ($O_3$) or the like, or a thermal oxide film is used.

The method of producing an insulator thin film, the insulator thin film, the method of manufacturing a semiconductor device, and the semiconductor device according to the present invention can be used for a gate insulation film in an insulated gate type field effect transistor which is a semiconductor device and for the production method thereof, and can be applied also to the uses of a method of producing a thin film having a metal atom concentration profile in an insulator thin film, and the insulator thin film produced by the producing method.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of producing an insulator thin film, for forming a thin film over a substrate by use of the atomic layer deposition process, said method comprising:

forming a silicon atomic layer over said substrate, and forming an oxygen atomic layer over said silicon atomic layer; and forming a metal atomic layer over said substrate, and forming an oxygen atomic layer over said metal atomic layer, and wherein the layers are formed such that a concentration ratio of metal/(metal+silicon) changes through the thin film.

2. A method of producing an insulator thin film as set forth in claim 1, wherein the concentration of said metal atoms in said insulator thin film is controlled by controlling the number of times said first step and said second step are carried out.

3. A method of producing an insulator thin film as set forth in claim 1, wherein nitrogen is added to said insulator thin film in the condition where a plasma is generated in an atmosphere containing nitrogen.

4. A method of producing an insulator thin film as set forth in claim 3, wherein said plasma is generated by electric discharge through use of a pulse power source.

5. A method of producing an insulator thin film as set forth in claim 1, wherein said insulator thin film is annealed in an inert atmosphere.

6. The method of producing an insulator thin film according to claim 1, wherein the layers are formed such that a concentration ratio of metal/(metal+silicon) gradually increases and decreases through the film thickness.

7. The method of manufacturing a semiconductor device according to claim 1, wherein the layers are formed such that a concentration ratio of metal/(metal+silicon) gradually increases and decreases through the film thickness.

8. A method of manufacturing a semiconductor device, comprising the step of forming an insulator thin film, wherein said insulator thin film forming comprises:

forming a silicon atomic layer over a substrate and forming an oxygen atomic layer over said silicon atomic layer, by use of the atomic layer deposition process; and forming a metal atomic layer over said substrate and forming an oxygen atomic layer over said metal atomic layer, by use of the atomic layer deposition process, and wherein the layers are formed such that a concentration ratio of metal/(metal+silicon) changes through the thin film.

9. A method of manufacturing a semiconductor device as set forth in claim 8, wherein the concentration of said metal atoms in said insulator thin film is controlled by controlling the number of times said first step and said second step are carried out.

10. A method of manufacturing a semiconductor device as set forth in claim 8, wherein nitrogen is added to said insulator thin film.

11. A method of manufacturing a semiconductor device as set forth in claim 8, wherein said insulator thin film is annealed in an inert atmosphere.

* * * * *